United States Patent
Kuo et al.

(10) Patent No.: US 8,883,524 B2
(45) Date of Patent: Nov. 11, 2014

(54) METHODS AND APPARATUS FOR CMOS SENSORS

(71) Applicant: Taiwan Semiconductor Manufacturing Company, Ltd., Hsin-Chu (TW)

(72) Inventors: Chun-Tsung Kuo, Tainan (TW); Jiech-Fun Lu, Madou Township (TW); Yeur-Luen Tu, Taichung (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/908,838

(22) Filed: Jun. 3, 2013

(65) Prior Publication Data
US 2014/0264506 A1  Sep. 18, 2014

Related U.S. Application Data

(60) Provisional application No. 61/784,044, filed on Mar. 14, 2013.

(51) Int. Cl.
| | |
|---|---|
| H01L 21/00 | (2006.01) |
| H01L 27/148 | (2006.01) |
| H01L 29/84 | (2006.01) |
| H01L 29/66 | (2006.01) |
| H01L 29/82 | (2006.01) |
| H01L 27/22 | (2006.01) |
| H01L 31/00 | (2006.01) |
| H01L 31/058 | (2006.01) |
| H01L 27/146 | (2006.01) |
| H01L 21/306 | (2006.01) |

(52) U.S. Cl.
CPC ........ *H01L 27/14643* (2013.01); *H01L 21/306* (2013.01); *H01L 27/14689* (2013.01)
USPC ............. 438/22; 257/444; 257/226; 257/232; 257/254; 257/423; 257/427; 257/440; 257/470

(58) Field of Classification Search
USPC ......... 257/226, 232, 254, 423, 424, 427, 440, 257/444, 470
See application file for complete search history.

(56) References Cited

U.S. PATENT DOCUMENTS

| | | | | |
|---|---|---|---|---|
| 6,326,652 | B1 * | 12/2001 | Rhodes | 257/231 |
| 6,372,537 | B1 * | 4/2002 | Lee et al. | 438/48 |
| 6,376,868 | B1 * | 4/2002 | Rhodes | 257/215 |
| 6,501,109 | B1 * | 12/2002 | Chi | 257/223 |
| 6,998,657 | B2 * | 2/2006 | Rhodes | 257/222 |

(Continued)

*Primary Examiner* — Evan Pert
*Assistant Examiner* — Gustavo Ramallo
(74) *Attorney, Agent, or Firm* — Slater & Matsil, L.L.P.

(57) ABSTRACT

Methods and apparatus for a sensor are disclosed. An oxide layer is formed on a substrate, followed by a spacer layer and a buffer layer. A photoresist layer is formed on the buffer layer over a pixel region, with an opening exposing a first part of the buffer layer. A first etching is performed to remove the first part of the buffer layer to expose a first part of the spacer layer. A second etching is performed to remove the first part of the spacer layer, the remaining buffer layer, and partially remove a second part of the spacer layer so that the result spacer layer will have an end with a shape substantially similar to a triangle, a height of the end is in a substantially same range as a length of the end.

20 Claims, 6 Drawing Sheets

(56) References Cited

U.S. PATENT DOCUMENTS

| | | | |
|---|---|---|---|
| 7,217,968 B2 * | 5/2007 | Adkisson et al. | 257/292 |
| 7,227,199 B2 * | 6/2007 | Hwang | 257/184 |
| 7,345,703 B2 * | 3/2008 | Lee | 348/272 |
| 7,560,674 B2 * | 7/2009 | Han | 250/200 |
| 7,611,918 B2 * | 11/2009 | Joon | 438/48 |
| 8,253,178 B1 * | 8/2012 | Yang et al. | 257/291 |
| 2006/0138484 A1 * | 6/2006 | Han | 257/291 |
| 2008/0203516 A1 * | 8/2008 | Shin | 257/444 |
| 2013/0285179 A1 * | 10/2013 | Lin et al. | 257/432 |

* cited by examiner

METHODS AND APPARATUS FOR CMOS SENSORS

This application claims the benefit of U.S. Provisional Application No. 61/784,044 filed on Mar. 14, 2013, entitled "Methods and Apparatus for CMOS Sensors," which application is hereby incorporated herein by reference.

BACKGROUND

Complementary metal-oxide semiconductor (CMOS) sensors are gaining in popularity over traditional charged-coupled devices (CCDs). A CMOS sensor typically comprises an array of pixels formed in a pixel region and logic circuits in a logic region on the sensor. A pixel region may comprise a light-sensitive CMOS circuit to convert photons into electrons. The light-sensitive CMOS circuit may comprise a photo-sensitive element, such as a photo-diode, formed in a silicon substrate. As the photo-sensitive element is exposed to light, an electrical charge is induced in the photo-sensitive element. Each pixel may generate electrons proportional to the amount of light that falls on the pixel when light is incident on the pixel from a subject scene. The electrons are converted into a voltage signal in the pixel region and further transformed into a digital signal and processed by logic circuits in the logic region on the sensor.

In addition to the photo-sensitive element, the pixel region may comprise a plurality of transistors such as a transfer transistor, a reset transistor, a source follower transistor, or a select transistor, connected to the photo-sensitive element. The logic region may comprise a plurality of transistors as well. A transistor comprises a gate made of electrically conductive materials surrounded by insulative materials such as spacers alongside the gate to insulate the gate from other conductive materials. Various features of a transistor such as the gate and the spacer may be made using photolithography techniques, where photoresist materials may be deposited and patterned to produce the intended features.

With the increasing shrinkage of the sizes of the devices such as the gates of the transistors, the thickness of the photoresist materials used in the photolithography process may be reduced as well. Photoresist materials with reduced thickness can cause damages to spacers of transistors in a pixel region during the etching process after the photoresist materials have been patterned. New methods and apparatus are needed to reduce damages to spacers of transistors in a pixel region, which can efficiently reduce the pixel width, while improving dark current and white pixel problems for the pixels.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1:
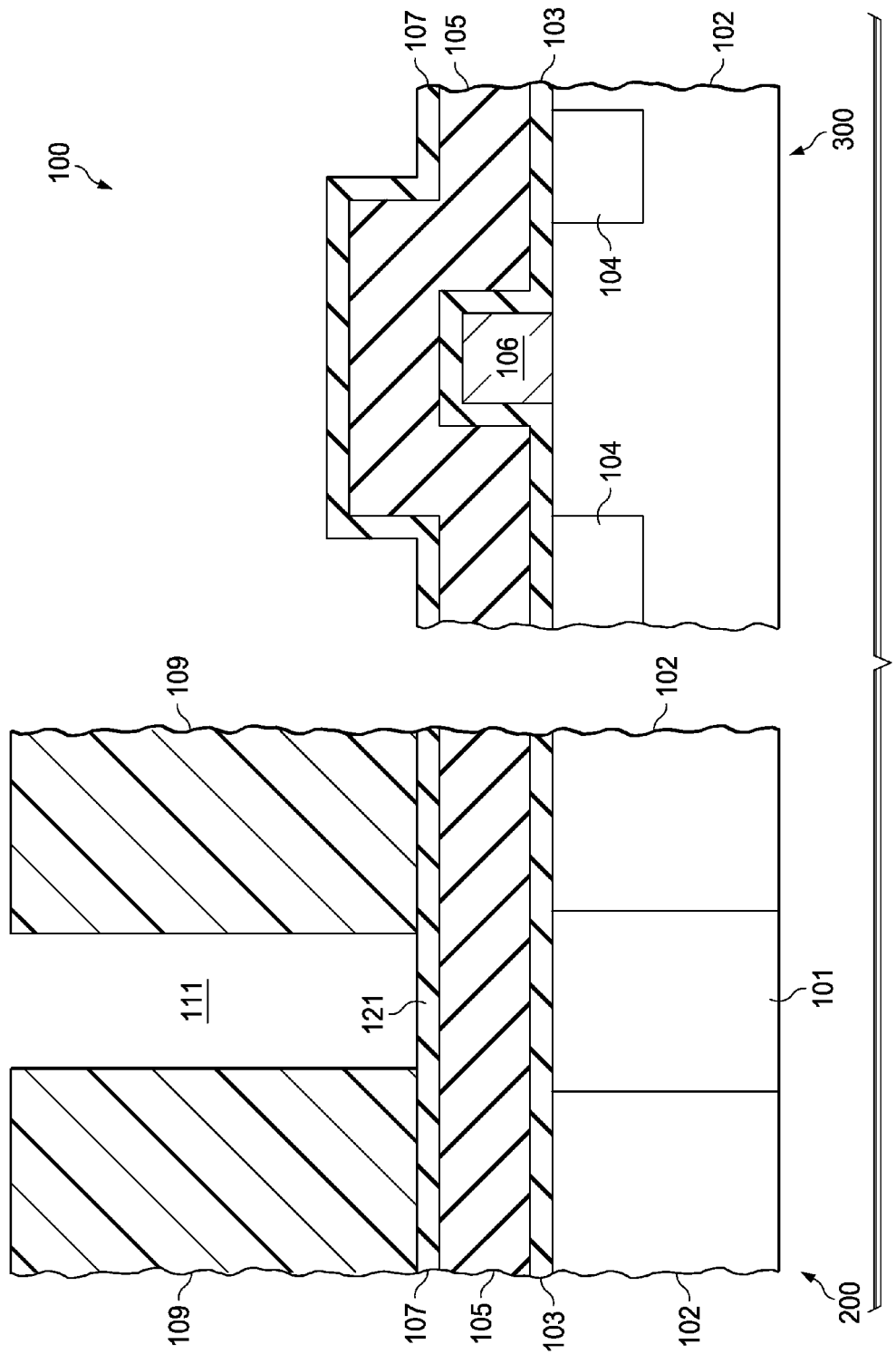
FIG. 1 illustrates a substrate of a sensor, the substrate having a pixel region and a logic region, an oxide layer, a spacer layer, and a buffer layer covering the substrate, and a photoresist layer formed on the buffer layer over the pixel region.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure discloses methods and apparatus for a sensor. According to the embodiments, an oxide layer is formed on a substrate, covering a pixel region and a logic region of the substrate. A spacer layer is formed on the oxide layer, and a buffer layer is formed on the spacer layer. A photoresist layer is formed on the buffer layer over the pixel region, wherein the photoresist layer has an opening exposing a first part of the buffer layer. The photoresist layer may be of insufficient thickness in current technology due to the shrinking sizes of the devices. The buffer layer under the photoresist layer can reduce the damages to the spacer layer under the buffer layer from etchings performed subsequently. A first etching is performed to remove the first part of the buffer layer to expose a first part of the spacer layer. A second etching is performed to remove the exposed first part of the spacer layer, the remaining buffer layer over a second part of the spacer layer, and partially remove the second part of the spacer layer so that the result spacer layer will have an end with a shape substantially similar to a triangle, a height of the end is in a substantially same range as a length of the end. Such shaped spacer layer can efficiently reduce the pixel width for the sensor.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 illustrates a cross-sectional view of a sensor 100 comprising a pixel region 200 and a logic region 300. The sensor 100 may comprise a grid or array of pixels in the pixel region 200. The pixel region 200 and the logic region 300 are formed in a substrate 102. A first area 101 is formed in the substrate within the pixel region 200. A first source/drain area 104 and a second source/drain area 104 are formed within the substrate 102 in the logic region 300. The logic region 300 further comprises a gate 106 formed above a channel between the first source/drain area 104 and the second source/drain area 104. The gate 106, the first source/drain area 104, and the second source/drain area 104 form a transistor in the logic region 300. An oxide layer 103 is formed on the substrate 102, covering the first area 101 within the pixel region 200, and also covering the gate 106 within the logic region 300. A spacer layer 105 is formed on the oxide layer 103 over the pixel region 200 and the logic region 300. A buffer layer 107 is formed on the spacer layer 105. Finally, a photoresist layer 109 is formed on the buffer layer 107 over the pixel region 200, wherein the photoresist layer 109 has an opening 111 exposing a first part 121 of the buffer layer 107 over the first area 101.

The substrate 102 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. The substrate 102 may be doped with a p-type dopant, such as boron, aluminum, gallium, or the like, although the substrate may alternatively be doped with an n-type dopant, as is known in the art.

Figure 6:
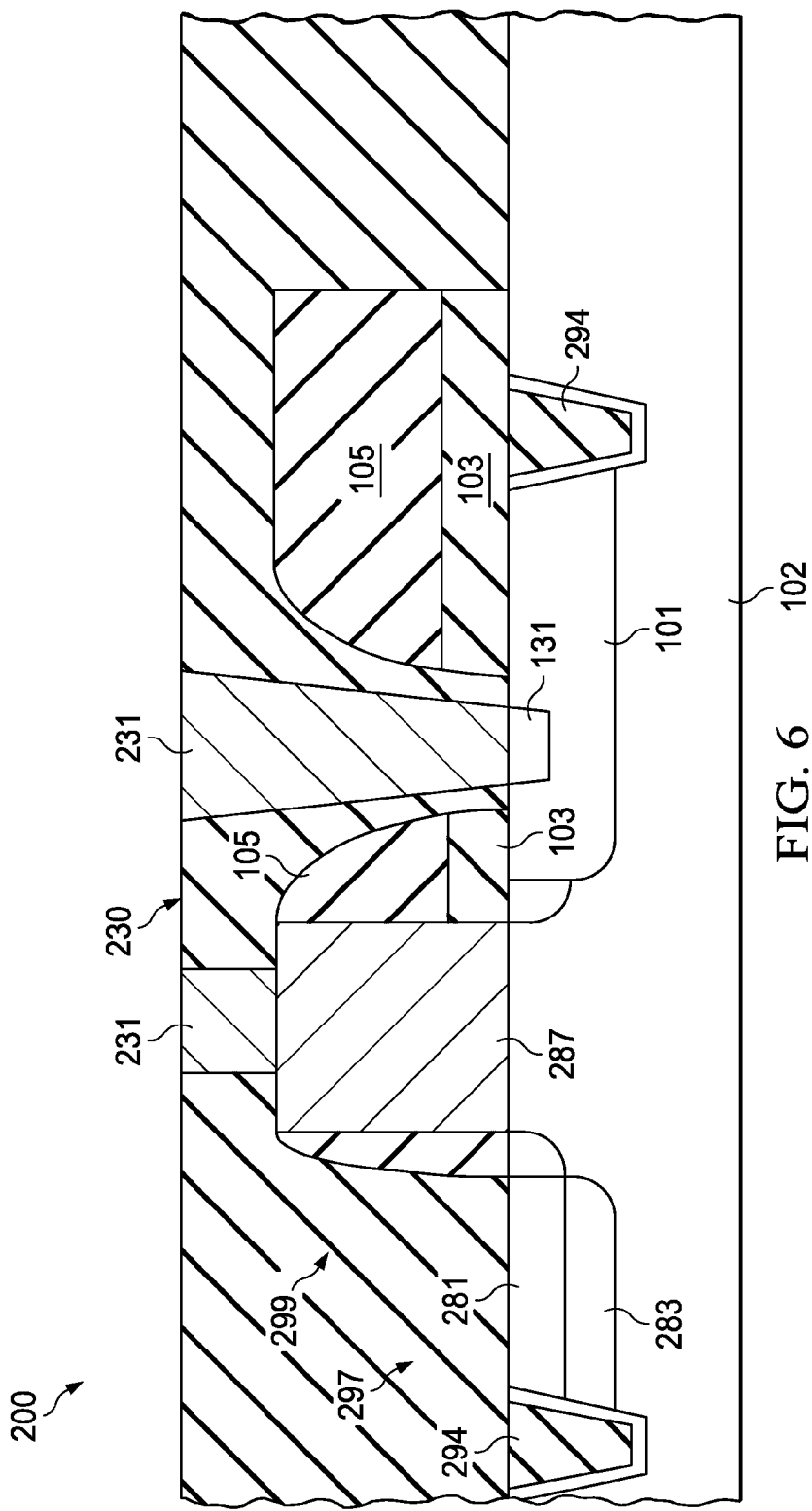
FIG. 6 illustrates a photo-sensitive element within the substrate, and the first area is a floating node connected to the photo-sensitive element by a transfer transistor, further forming an inter-layer dielectric (ILD) layer on the spacer layer and in contact with the first area, and forming a contact through the ILD layer and in contact with the first area.

The substrate 102 may comprise a plurality of isolation areas, which will be shown in FIG. 6, to separate and isolate various devices formed on the substrate 102, and also to separate the pixel region 200 from the logic region 300 of a sensor. The isolation areas may be shallow trench isolations generally formed by etching the substrate 102 to form a trench and filling the trench with dielectric material as is known in the art.

The substrate 102 may comprise a photo-sensitive element in the pixel region 200. The photo-sensitive element may be simply referred as a photo-diode, which may generate a signal related to the intensity or brightness of light that impinges on the photo-sensitive element. The photo-sensitive element may be connected to a plurality of transistors such as a transfer transistor, a reset transistor, a source follower transistor, or a select transistor, which will be shown in FIG. 6. The substrate 102 may comprises a first region 101 within the substrate 102. The first region 101 may be a floating node in the pixel region 200, or a part of some other devices.

The substrate 102 may comprise a plurality of active or passive devices, such as a plurality of transistors. One such transistor is shown in FIG. 1. The substrate 102 comprises a first source/drain area 104 and a second source/drain area 104 within the substrate 102 in the logic region 300. The logic region 300 further comprises a gate 106 formed above a channel between the first source/drain area 104 and the second source/drain area 104. The gate 106, the first source/drain area 104, and the second source/drain area 104 form a transistor in the logic region 300. Other transistors may be formed in the pixel region 200 as well, not shown.

An oxide layer 103 is formed on the substrate 102, covering the first area 101 within the pixel region 200, and covering the gate 106 within the logic region 300. The oxide layer 103 may comprise tetraethylorthosilicate (TEOS) silicon oxide thin film, which may be deposited using plasma enhanced chemical vapor deposition (PECVD) method or other suitable methods, under the pressure around 1 Torr, and temperature around 375° C., or other suitable environments. The oxide layer 103 may have a thickness in a range from about 300 to about 500 Angstroms(Å).

A spacer layer 105 is formed on the oxide layer 103. The spacer layer 105 may be on the oxide layer 103 in both the pixel region 200 and the logic region 300. The spacer layer 105 may cover the side and the top of the gate 106 in the logic region 300. The spacer layer 105 may comprise silicon nitride material, and formed by chemical vapor deposition, and with an exemplary thickness from about 300 to about 500 Angstroms(Å).

A buffer layer 107 is formed on the spacer layer 105. The buffer layer 107 may be formed with similar material as the oxide layer 103. The buffer layer 107 may comprise tetraethylorthosilicate (TEOS) silicon oxide thin film, which may be deposited using plasma enhanced chemical vapor deposition (PECVD) method or other suitable methods, under the pressure around 1 Torr, and temperature around 375° C., or other suitable environments. The buffer layer 107 may have a thickness in a range from about 300 to about 500 Angstroms (Å).

A photoresist layer 109 is formed on the buffer layer 107 over the pixel region 200. The photoresist layer 109 has an opening 111 exposing a first part 121 of the buffer layer 107 over the first area 101. The photoresist layer 109 may comprise benzene-based polymers or other similar materials. The formation methods include spin coating or other commonly used methods. The thickness of photoresist layer 109 may be between about 5 µm and about 200 µm. The dimensions recited throughout the description are merely examples, and will change with the down-scaling of integrated circuits. The opening 111 of the photoresist layer 109 may be formed using photolithography techniques.

Figure 2:
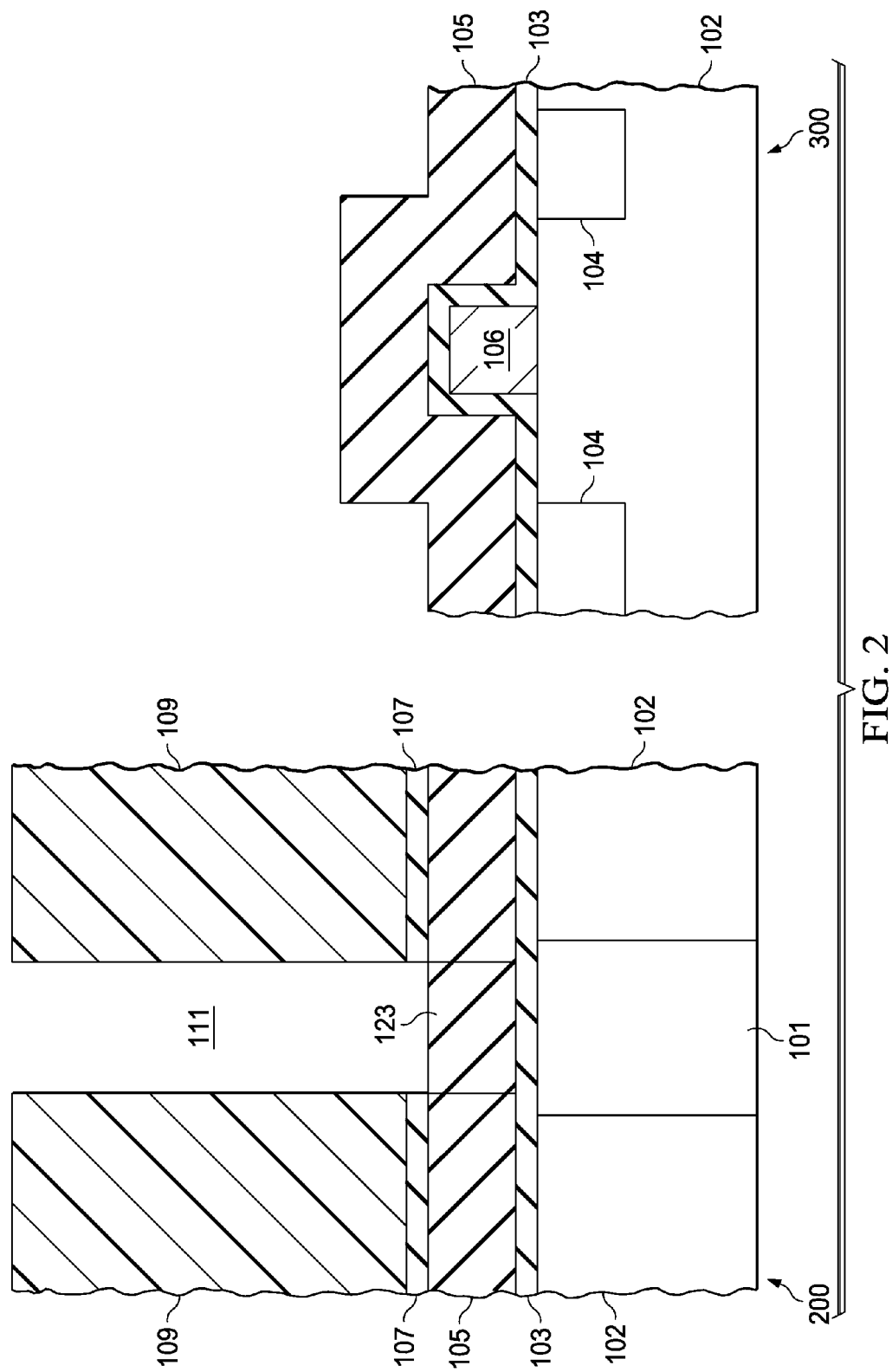
FIG. 2 illustrates performing a first etching to remove a part of the buffer layer not covered by the photoresist layer in the pixel region, and to remove the buffer layer in the logic region.

As illustrated in FIG. 2, the first part 121 of the buffer layer 107 shown in FIG. 1 may be removed by a first etching, to expose a first part 123 of the spacer layer 105 over the first area 101, while leaving a remaining part of the buffer layer 107 covered by the photoresist layer 109 intact. The first etching may also remove the buffer layer 107 over the logic region 300, to expose the spacer layer 105 over the first gate 106. The first etching may be a wet etching. The wet etching may be performed by using wet etching solutions containing an oxidizing agent and a complex agent. In addition, the etching solutions may optionally include one or more pH adjustors. The sensor 100 may be in contact with the wet etching solution, including but not limited to by spraying the etching solution on the sensor 100, or by immersing the sensor 100 into the etching solution.

Figure 3:
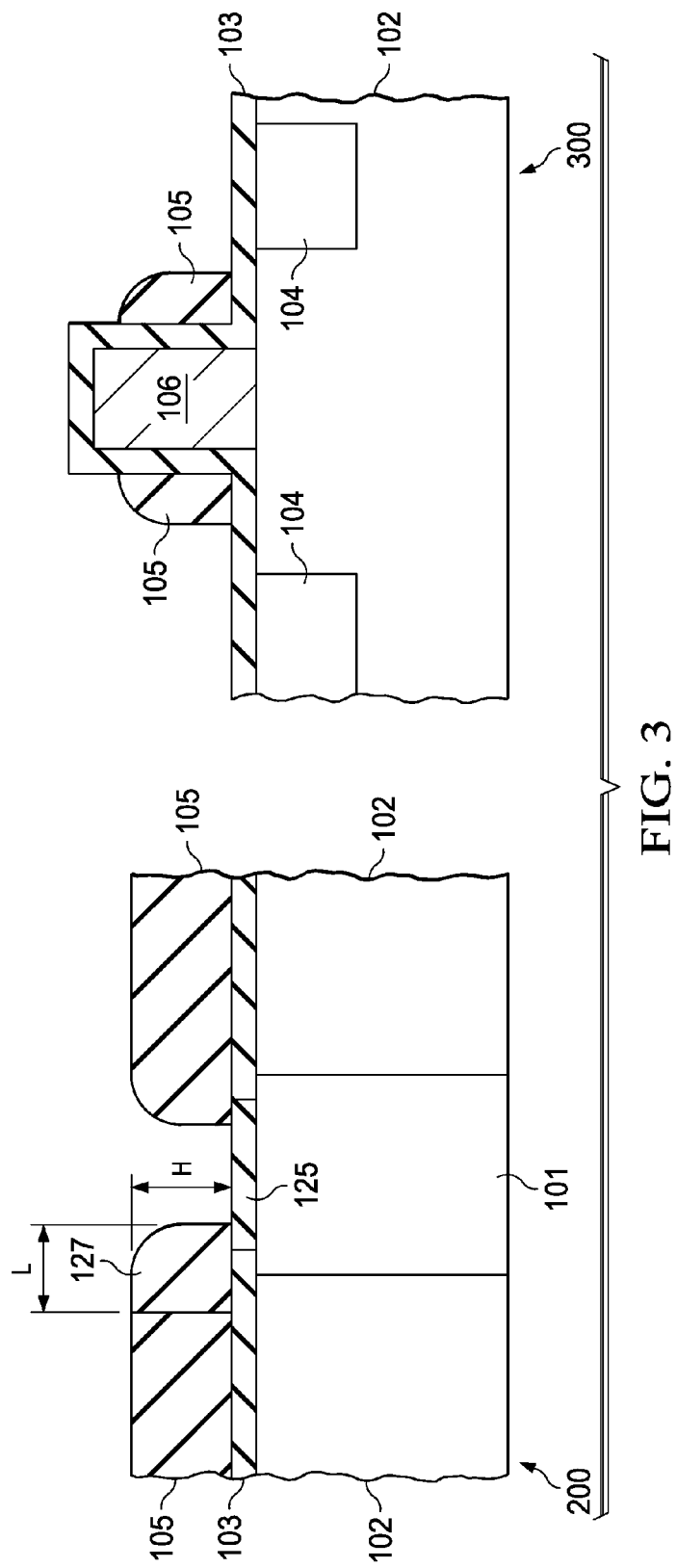
FIG. 3 illustrates removing the photoresist layer, and performing a second etching to remove the remaining part of the buffer layer, removing a part of the spacer layer in the pixel region, and removing the spacer layer over a gate of a transistor in the logic region, while keeping the spacer layer around the gate of the transistor.

As illustrated in FIG. 3, the photoresist layer 109 may be stripped from the pixel region 200. After the stripping, second etching is performed on the remaining part of the buffer layer 107 over the pixel region 200. The second etching removes the first part 123 of the spacer layer 105 to expose a first part 125 of the oxide layer 103 on the first area 101. The second etching may also remove the spacer layer 105 over the first gate 106 to expose the oxide layer 103 on the first gate 106, while keeping the spacer layer 105 around the first gate 106. The second etching may be a dry etching, performed using chemicals such as, $CF_4$, or $CHF_3$. Any existing etching technology or future developed etching technology may be used.

The remaining part of the buffer layer 107 over the pixel region 200 acts as a buffer for the second etching process, to reduce the first part 123 of the spacer layer 105 been removed by the second etching. The reaming part of the spacer layer 105 has a higher remaining height compared to the result if the second etching would be performed on the spacer layer 105 without the buffer layer 107. Similarly, the first part 123 of the spacer layer 105 been removed has a smaller width compared to the first part 123 would have been removed without the buffer layer 107. The remaining part of the spacer layer 105 comprises a first end 127 over one side of the first area 101, and a second end over another side of the first area 101. As illustrated in FIG. 3, the first end 127 may have a shape substantially similar to a triangle, a height H of the first end 127 may be in a substantially same range as a length L of the first end 127. The larger remaining part of the spacer layer 105 can efficiently reduce the pixel width, while improving dark current and white pixel problems for the pixels.

Figure 4:
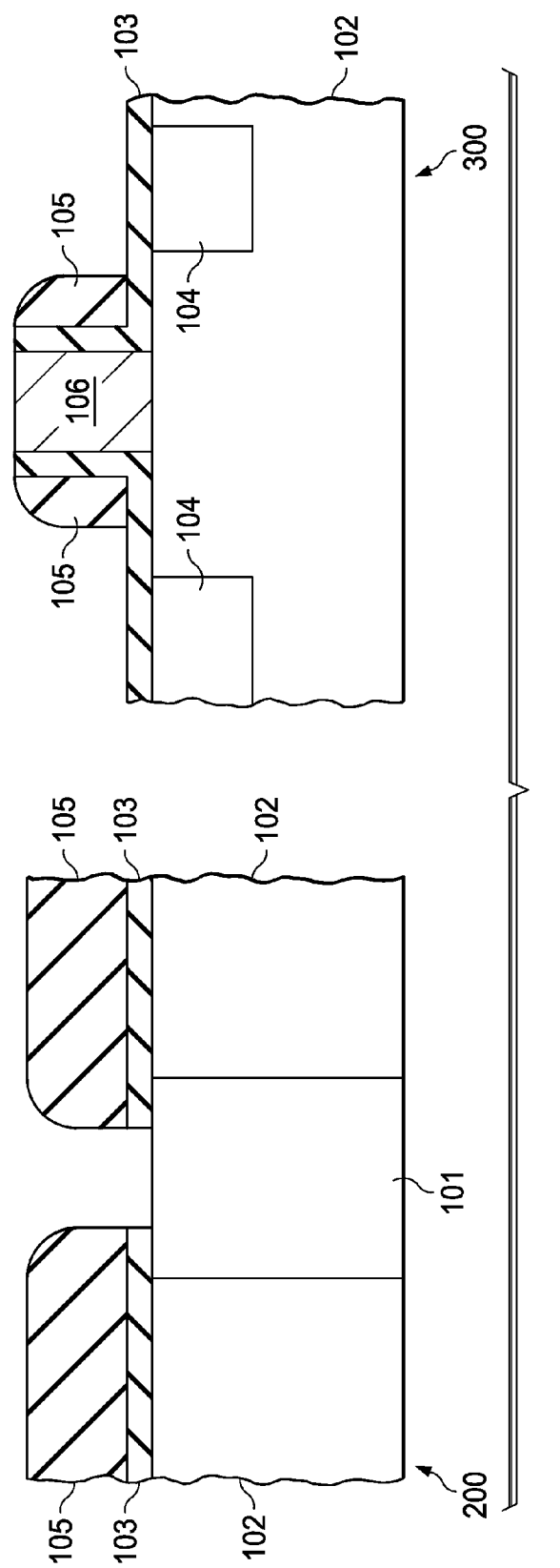
FIG. 4 illustrates performing a third etching to remove a part of the oxide layer in the pixel region, and remove the oxide layer on the gate of the transistor in the logic region to expose the gate of the transistor in the logic region.

As illustrated in FIG. 4, the first part 125 of the oxide layer 103 may be removed by a third etching, to expose the first area 101. The third etching may also remove the oxide layer 103 on the first gate 106 to expose the first gate 106. The third etching may be a wet etching. The wet etching may be done by using wet etching solutions containing an oxidizing agent and a complex agent. In addition, the etching solutions may optionally include one or more pH adjustors. The sensor 100 may be in contact with the wet etching solution, including but not limited to by spraying the etching solution on the sensor 100, or by immersing the sensor 100 into the etching solution.

Figure 5:
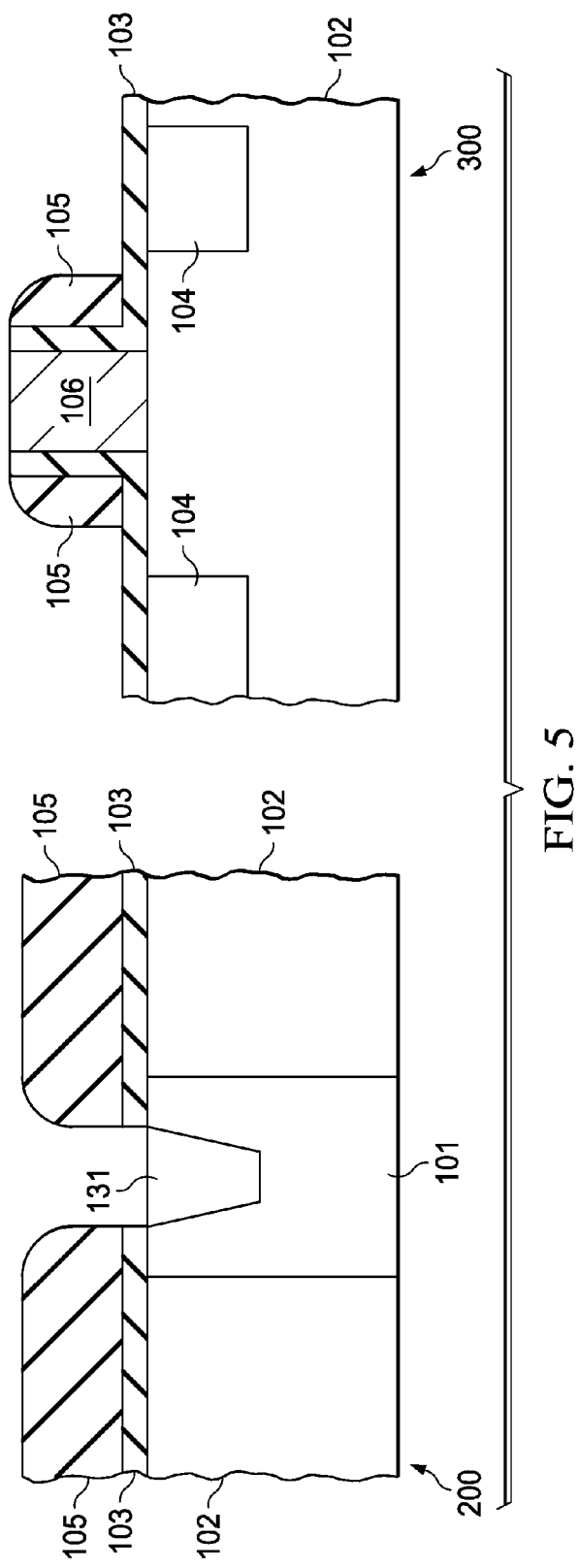
FIG. 5 illustrates forming of a p+ doped area within a first area in the pixel region.

As illustrated in FIG. 5, a doped area 131 may be formed within the exposed first area 101. The doped area 131 may be a p+ type doped area formed by doping with boron or $BF_2$, for example. In one embodiment, boron is implanted using 500 eV-20 KeV, of energy and a dopant concentration of 5e14 ions/$cm^2$ to 5e16 ions/$cm^2$. Other implant energies and dopant concentrations may also be used, depending upon specific desired device characteristics and other design considerations. The doped area 131 may be done during an insitu doping process.

As illustrated in FIG. 6, an inter-layer dielectric (ILD) layer 230 may be formed on the spacer layer 105 and in contact with the first area 101 and the doped area 131. A contact 231 may be formed through the ILD layer 230 and in contact with the first area 101 and/or the doped area 131. The ILD layer 230 may comprise a material such as boron phosphorous silicate glass (BPSG), although any suitable dielectrics may be used for either layer. Contacts 231 may be formed through the ILD layer 230 with suitable photolithography and etching techniques. The contacts 231 may comprise a barrier/adhesion layer, not shown, to prevent diffusion and provide better adhesion for the contacts 231.

As illustrated in FIG. 6, the substrate 102 may further comprise a photo-sensitive element 297 within the pixel region 200. The first area 101 may be a floating node, and a transfer transistor 299 with a second gate 287 is above a channel between the floating node 101 and the photo-sensitive element 297. The substrate 210 may comprise a plurality of isolation areas 294 to separate and isolate various devices formed on the substrate 210, and also to separate the pixel regions 200 from other logic regions of the sensor.

The photosensitive element 297 may be a pinned photodiode, comprising a p-type doped region 283 formed in the substrate 102. It also may comprise a heavily doped n-type region 281 (referred to as the pinned layer) formed on the surface of the p-type doped region 283 to form a n-p-n junction. As one of ordinary skill in the art will recognize, the pinned layer photodiode described above is merely one type of photosensitive diode 297 that may be used in the embodiments. For example, a non-pinned layer photodiode, partially pinned photodiode, photogate, or photocapacitor, may alternatively be used. Any suitable photodiode may be utilized with the embodiments, and all of these photodiodes are intended to be included within the scope of the embodiments.

The substrate 210 may comprise a plurality of isolation areas 294 to separate and isolate various devices formed on the substrate 210, and also to separate the pixel region 200 from other logic regions of the sensor. The isolation areas 294 may be shallow trench isolations generally formed by etching the substrate 210 to form a trench and filling the trench with dielectric material as is known in the art. Optionally, an oxide liner may be formed along the sidewalls of the isolation areas 294.

A transfer transistor 299 having a transfer gate 287 is used to transfer the signal output by the photodiode 297 to the floating node 101, which may further be connected to other transistors such as an amplification transistor through the contact 231. The transfer gate 287 may be connected to a contact 231 as well. In operation, during an integration period (also referred to as an exposure or accumulation period), the photodiode 297 generates charge (in response to incident light) that is held in the n− layer 281 of the photodiode 297. After the integration period, the transfer gate 287 is turned on to transfer the charge held in the n− layer 281 to the floating node 101. After the signal has been transferred to the floating node 101, the transfer gate 287 is turned off again for the start of a subsequent integration period. The signal on the floating node 101 may then be used to modulate the amplification transistor, which is not shown.

A method of forming a sensor is disclosed. An oxide layer is formed on a substrate, covering a first area within a pixel region of the substrate, and covering a first gate of a first transistor within a logic region of the substrate, wherein the substrate comprises the pixel region and the logic region. A spacer layer is formed on the oxide layer, a buffer layer is formed on the spacer layer, and a photoresist layer is formed on the buffer layer over the pixel region, wherein the photoresist layer has an opening exposing a first part of the buffer layer over the first area. A first etching is performed to remove the first part of the buffer layer to expose a first part of the spacer layer over the first area, and to remove the buffer layer to expose the spacer layer over the first gate, while leaving a remaining part of the buffer layer covered by the photoresist layer intact. The photoresist layer is then removed. A second etching is performed to remove the remaining part of the buffer layer, remove the first part of the spacer layer to expose a first part of the oxide layer on the first area, while leaving a second part of the spacer layer over the pixel region, and remove the spacer layer over the first gate to expose the oxide layer on the first gate, while keeping the spacer layer around the first gate. A third etching is performed to remove the first part of the oxide layer to expose the first area, and remove the oxide layer on the first gate to expose the first gate.

A device for a sensor is disclosed. The device comprises a substrate comprising a pixel region and a logic region, wherein the pixel region comprises a first area, and the logic region comprises a source and a drain. A first gate of a first transistor is above a first channel between the source and the drain. An oxide layer is on the substrate, wherein the oxide layer covers the substrate with an opening to expose the first area in the pixel region, and the oxide layer surrounds a sidewall of the first gate of the first transistor. A spacer layer is on the oxide layer, wherein the spacer layer covers the oxide layer over the pixel region, with an end next to the opening of the oxide layer, the end has a shape substantially similar to a triangle, a height of the end is in a substantially same range as a length of the end, and the spacer layer surrounds the sidewall of the first gate in the logic region.

A device for a sensor is disclosed. The device comprises a substrate comprising a pixel region and a logic region. The pixel region comprises a photo-sensitive element, and a floating node, while the logic region comprises a source and a drain. A first gate of a first transistor is above a first channel between the source and the drain, and a second gate of a transfer transistor is above a second channel between the floating node and the photo-sensitive element. An oxide layer is on the substrate, wherein the oxide layer covers the substrate with an opening to expose the floating node, and the oxide layer surrounds a sidewall of the first gate of the first transistor. A spacer layer is on the oxide layer, wherein the spacer layer covers the oxide layer over the pixel region, with an end next to the opening of the oxide layer. The end of the spacer layer has a shape substantially similar to a triangle, a height of the end is in a substantially same range as a length of the end, and the spacer layer surrounds the sidewall of the first gate in the logic region.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a sensor, comprising:
providing a substrate comprising a pixel region and a logic region, the pixel region having a first area and the logic region having a first gate of a first transistor;
forming an oxide layer covering the first area within the pixel region and covering the first gate within the logic region;
forming a spacer layer and a buffer layer over the oxide layer;
forming a photoresist layer on the buffer layer over the pixel region, wherein the photoresist layer has an opening exposing a first part of the buffer layer over the first area;
performing a first etching to remove the first part of the buffer layer to expose a first part of the spacer layer over the first area, and to remove the buffer layer to expose the spacer layer over the first gate, while leaving a remaining part of the buffer layer covered by the photoresist layer intact;
removing the photoresist layer;
performing a second etching to remove the remaining part of the buffer layer, remove the first part of the spacer layer to expose a first part of the oxide layer on the first area, while leaving a second part of the spacer layer over the pixel region, and remove the spacer layer over the first gate to expose the oxide layer on the first gate, while keeping the spacer layer around the first gate; and
performing a third etching to remove the first part of the oxide layer to expose the first area, and remove the oxide layer on the first gate to expose the first gate.

2. The method of claim 1, further comprising:
forming an inter-layer dielectric (ILD) layer on the second part of the spacer layer and in contact with the first area; and
forming a contact through the ILD layer and in contact with the first area.

3. The method of claim 1, wherein the second part of the spacer layer over the pixel region comprises an end with a shape substantially similar to a triangle, a height of the end is in a substantially same range as a length of the end.

4. The method of claim 1, wherein the first etching is a wet etching.

5. The method of claim 1, wherein the second etching is a dry etching.

6. The method of claim 1, wherein the third etching is a wet etching.

7. The method of claim 1, wherein the substrate further comprises a photo-sensitive element within the pixel region, the first area is a floating node, and a transfer transistor with a second gate is above a channel between the floating node and the photo-sensitive element.

8. The method of claim 1, wherein forming the spacer layer comprises forming the spacer layer with silicon nitride.

9. The method of claim 1, wherein the first area comprises a p+ doped area.

10. A method of forming a sensor, comprising:
- forming within a substrate a node region and a source/drain region;
- forming on the substrate gate transistor gate adjacent the source/drain region;
- forming on the substrate an oxide layer, the oxide layer covering the node region, the source/drain region, and the transistor gate;
- forming on the oxide layer a spacer layer;
- forming on the spacer layer a buffer layer;
- patterning the buffer layer to expose a first portion of the spacer layer overlying the node region and a second portion of the buffer layer overlying the source/drain region and the transistor gate;
- etching the first portion of the spacer layer to form an opening therein exposing the oxide layer overlying the node region and etching the second portion of the spacer layer to form spacers on respective sidewalls of the transistor gate; and
- removing the exposed oxide layer overlying the node region and removing the oxide layer overlying the transistor gate.

11. The method of claim 10, further comprising doping the node region thorough the hole in the spacer layer.

12. The method of claim 10, wherein the step of forming on the substrate an oxide layer comprises depositing a TEOS silicon oxide film.

13. The method of claim 10, wherein the step of forming on the oxide layer a spacer layer comprises depositing a layer of silicon nitride.

14. The method of claim 10, wherein the step of forming on the spacer layer a buffer layer comprises depositing a TEOS silicon oxide film.

15. The method of claim 10, wherein the step of patterning the buffer layer comprises forming a patterned masking layer over the buffer layer, the patterned masking layer exposing first regions of the buffer layer and covering second regions of the buffer layer, and wet etching the first regions of the buffer layer.

16. The method of claim 15, wherein the step of etching the first portion of the spacer is an isotropic etch that forms rounded sidewalls.

17. A method of forming a sensor, comprising:
- forming a logic transistor in a logic region of a substrate, the logic transistor including a gate;
- forming a node region in a pixel region of a substrate;
- covering the logic transistor and the node region with an oxide layer;
- covering the oxide layer with a spacer layer;
- covering the spacer layer with a buffer layer;
- selectively removing the buffer layer in a first region aligned to the node region and a second region aligned with the logic transistor, while leaving a remainder of the buffer layer intact;
- using the remainder of the buffer layer as a masking layer, selectively etching the spacer layer to form spacers on respective sidewalls of the logic transistor gate and simultaneously forming an opening in the spacer layer that exposes a portion of the oxide layer aligned with the node region;
- selectively removing the portion of the oxide layer aligned with the node region from and simultaneously selectively removing a portion of the oxide layer overlying the logic transistor gate.

18. The method of claim 17, further comprising doping the node region with an impurity.

19. The method of claim 17, wherein the step of selectively etching the spacer layer comprises a wet etch process applied to the spacer layer while a portion of the spacer layer is covered by the buffer layer.

20. The method of claim 17, wherein the opening in the spacer layer has a sidewall profile and wherein the presence of the buffer layer during the wet etch process affects the sidewall profile.

* * * * *